United States Patent [19]
McCurdy et al.

[11] Patent Number: 4,825,148
[45] Date of Patent: Apr. 25, 1989

[54] RESISTANCE MEASUREMENT CIRCUIT AND METHOD

[75] Inventors: Roger A. McCurdy, Troy; Dana A. Stonerook, Plymouth, both of Mich.

[73] Assignee: TRW Inc., Lyndhurst, Ohio

[21] Appl. No.: 134,953

[22] Filed: Dec. 18, 1987

[51] Int. Cl.$^4$ ............................................ G01R 27/14
[52] U.S. Cl. ...................................... 324/64; 324/62
[58] Field of Search ............................ 324/62, 64, 525

[56] References Cited

U.S. PATENT DOCUMENTS 4,426,617  1/1984  Forrester ................................ 324/62

Primary Examiner—Reinhard J. Eisenzopf
Assistant Examiner—Anthony L. Miele
Attorney, Agent, or Firm—Tarolli, Sundheim & Covell

[57] ABSTRACT

An impedance measurement circuit and method is disclosed that uses a differential amplifier to amplify a DC voltage value developed across a device being measured. The device is biased between potentials of a source of electrical energy by first and second bias resistors. A switchable current source is connected to the device to, when actuated ON, connect the device to the source of electrical energy through first and second associated resistors. The ratio of the values of the first to second bias resistors is substantially equal to the ratio of the values of the first to second resistors associated with the switchable current source. A microcomputer calculates the resistance of the device by subtracting the value of the output signal from the differential amplifier when the switchable current source is OFF from the value when the switchable current source is ON. The difference is multiplied by a constant having a value dependent upon the gain of the amplifier and divided by a value functionally related to the value of the source of electrical energy. In this manner, the effects of common-mode errors and differential-mode errors are eliminated from a calculation of the resistance value of the device.

21 Claims, 1 Drawing Sheet

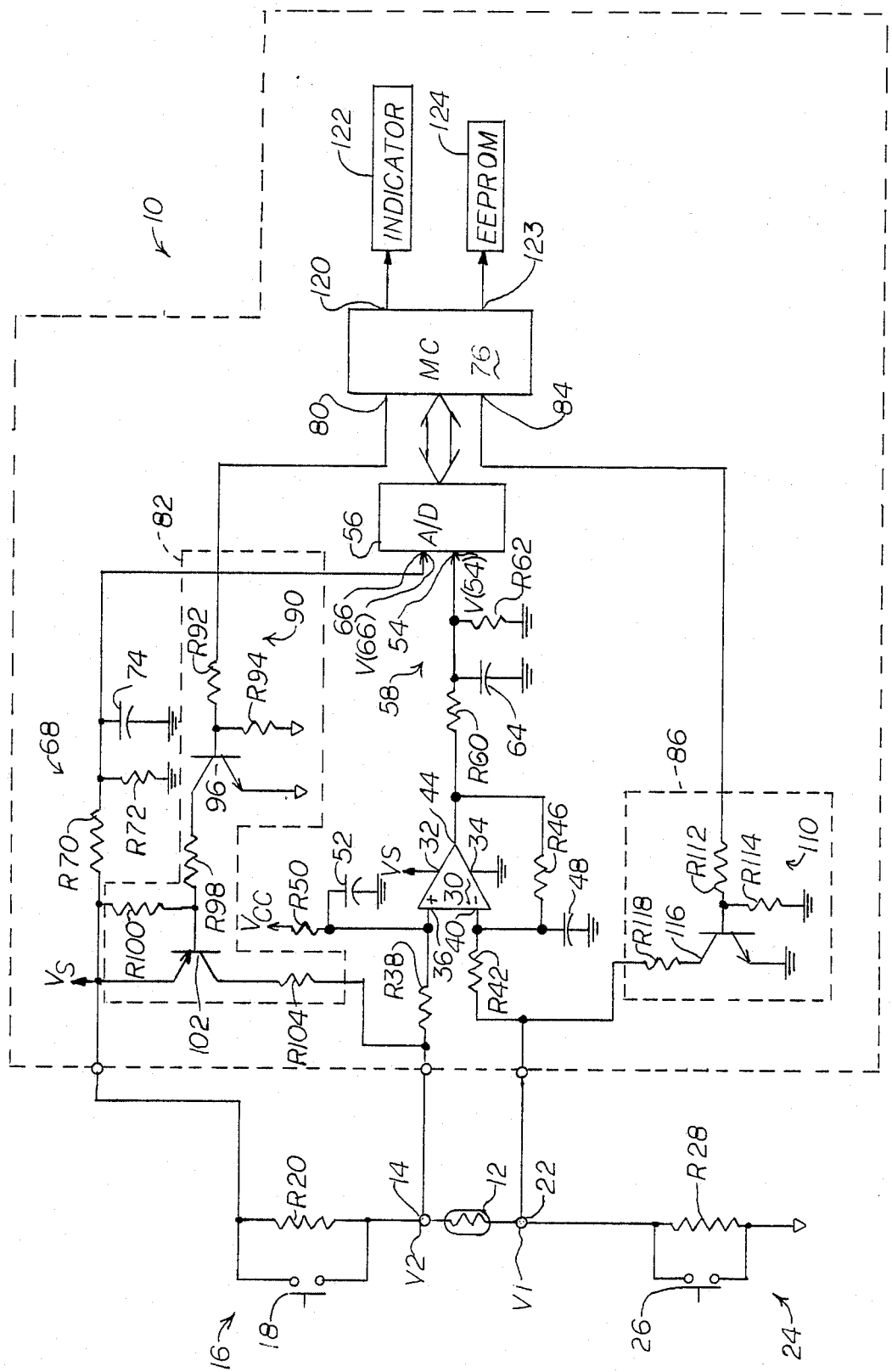

RESISTANCE MEASUREMENT CIRCUIT AND METHOD

TECHNICAL FIELD

The present invention relates to an impedance measurement circuit and method and is particularly directed to a circuit and method that eliminates effects of common-mode voltage and differential-mode voltage errors in a resistance measurement circuit of the type using a differential amplifier.

BACKGROUND ART

It is known from Ohm's law that a voltage is developed across an electrically resistive device when current is passed therethrough. The value of the developed voltage is functionally related to (i) the resistance of the device and (ii) the amount of current through the device. If both the current and resistance values are relatively small, the developed voltage is small.

It is known in the art to use a differential amplifier for amplifying a voltage value developed across a device being monitored where the developed voltage value is small. Some known circuits use an integrated circuit, operational amplifier configured so as to function as a differential amplifier.

One problem with integrated circuit, differential amplifiers is the amplification of a common-mode voltage present at its inputs. If the inputs of the amplifier are connected together to make the differential voltage zero and the inputs are connected to a common-mode voltage value, the common-mode voltage value is amplified thereby causing a voltage signal to be present at the output of the amplifier. The value of this signal is directly proportional to the common-mode gain of the amplifier. The common-mode gain of an integrated circuit, differential amplifier is equal to the differential-mode gain of the amplifier divided by the common-mode rejection ratio of the amplifier. Thus, the signal at the output of the amplifier caused by the common-mode voltage present at its inputs varies inversely with the common-mode rejection ratio.

The common-mode rejection ratio of known integrated circuit, amplifiers is finite. Therefore, a variance in the value of the amplifier output signal resulting from the common-mode voltage cannot be ignored when the differential-mode gain of the amplifier circuit is relatively large. Use of a large gain, differential amplifier to amplify a DC voltage developed across a small impedance device results in an output signal that is not sufficiently accurate to permit a meaningful calculation of the resistance of the device.

Any changes in the value of the common-mode voltage present at the device being monitored causes changes in the value of the output signal of the differential amplifier. Also, components used to configure the integrated circuit, operational amplifier as a differential amplifier have their electrical characteristic specified within a tolerance value. As the actual characteristic values vary, the gain of the amplifier varies.

One particular art that uses a differential amplifier to monitor operativeness of an electrical device having a relatively small resistive value is automotive, air bag diagnostic circuits used in automotive, air bag systems. One component of an air bag system is known as a primer or squib. The primer "fires" when a sufficient amount of electrical current is passed therethrough. When the primer is "fired," a gas generating material is ignited to provide pressurized fluid to inflate an air bag. Typically, primers have a relatively small impedance of approximately one to four ohms.

U.S. Pat. No. 4,287,431 discloses an air bag diagnostic circuit used to monitor, among other things, the operativeness of a primer. In accordance with the '431 patent, an air bag system includes two, parallel-connected primers. The primers are connected to the vehicle battery through two inertia switches Each connection terminal of the primers has one inertia switch connected thereto Each inertia switch has an associated resistor connected thereacross. Each of the associated resistors has a resistance value substantially greater than the resistance value of the parallel-connected primers. An electrical test current having a value less than that required to "fire" the primers is established through the inertia switch resistors and through the primers This test current establishes a voltage across the primers A diagnostic circuit is connected to the primers. The diagnostic circuit includes a differential amplifier having its two inputs connected to respective connection terminals of the primers. The output of the differential amplifier is an electrical signal having a value related to the value of the voltage developed across the primers.

If the primers are open circuited, the output of the differential amplifier is greater than a first predetermined value. If the primers are short circuited, the output of the differential amplifier is less than a second predetermined value. A comparator circuit is connected to the output of the differential amplifier. The comparator circuit provides a signal to actuate an indicator when the output of the differential amplifier indicates the primers are open or short circuited. The indicator warns the vehicle operator of a malfunction in the vehicle's air bag system. The diagnostic circuit disclosed in the '431 patent provides an indication of only extreme electrical conditions of the primers, i.e., the primers are open or short circuited.

Several factors exist in a circuit of the type disclosed in the '431 patent that prevent the differential amplifier output signal from being useful for accurately determining the resistance of the primers. Variations in the amplifier output signal can occur resulting from (i) variations in the differential voltage developed across the device or changes in the gain of the differential amplifier ("differential-mode errors"), and (ii) the presence of or changes in a common-mode voltage value at the inputs of the amplifier ("common-mode errors").

The output, Vout, of the differential amplifier disclosed in the '431 patent can be expressed as:

$$\text{Vout} = [(R15/R14)((R14+R16)/(R13+R15))]V2 - (R16/R14)V1 \tag{A}$$

where V1 is the voltage value at the input of resistor R14 and V2 is the voltage value at the input of resistor R13. Vcm is defined as the common-mode voltage present at the primers 2 and 3, and Vdiff is defined as the voltage value developed across the primers 2 and 3.

By definition:

$$V1 = Vcm - \tfrac{1}{2}Vdiff, \text{ and} \tag{B}$$

$$V2 = Vcm + \tfrac{1}{2}Vdiff \tag{C}$$

Substituting equations (B) and (C) into equation (A) yields:

$$V_{out} = [(R15/R14)((R14+R16)/(R13+R15))](V_{cm} + \tfrac{1}{2}V_{diff}) - (R16/R14)(V_{cm} - \tfrac{1}{2}V_{diff}) \quad (D)$$

Differential-mode errors arise when the gain resistors of the differential amplifier are mismatched, the values of the resistors associated with the inertia switches change, or the value of the battery voltage changes. These differential-mode errors cause Vdiff to vary which, in turn, causes Vout to vary.

Common-mode errors arise when a common-mode voltage value is present at the inputs of the differential amplifier, the common-mode voltage value at the inputs change because of changes in the values of resistors associated with the inertia switches, and the common-mode voltage value shifts because of changes in the value of the battery voltage. The presence of a common-mode voltage value plus changes in the common-mode voltage value causes uncertainty in the value of Vout. Because of these possible variances in the output voltage of the differential amplifier from both differential-mode errors and common-mode errors, the output signal of the differential amplifier is not useful for accurately determining the resistance value of the primers.

In the air bag art, an accurate measurement of the resistance value of the primers or squibs is useful to prevent false error signals from being provided by the air bag diagnostic circuit. Also, an accurate determination of the resistance value of the primers or squibs aids in determining which of any components are inoperative in the remainder of the air bag system.

SUMMARY OF THE INVENTION

The present invention provides a new and improved impedance monitoring circuit and method for accurately measuring the resistance of a small impedance device. The present invention provides a monitoring circuit and method that uses a differential amplifier in combination with a switchable current source to eliminate effects of (i) the presence of a common-mode voltage at the device being measured, (ii) changes in the common-mode voltage at the device due to changes in supply voltage, and (iii) changes in the differential-mode voltage not caused by changes in the resistance of the device.

In accordance with the present invention, a circuit for monitoring the resistance of an electrical device biased between potentials of a source of electrical energy by series, bias resistors connected to respective terminals of the device is provided. The circuit comprises a differential amplifier having its input terminals connected to respective terminals of the device. The differential amplifier provides an output signal having a value indicative of the voltage developed across the device.

The circuit further includes a switchable current source connected to the device. The switchable current source has first switching means and an associated first resistor connected in series between one terminal of the device and one potential of the source of electrical energy. The switchable current source further includes a second switching means and an associated second resistor connected in series between the other terminal of the device and the other potential of the source of electrical energy. When the second current source is ON, a second voltage is developed across the device resulting from the current through the device from the series, bias resistors and current through the device from the switchable current source. The ratio of the values of the first to second resistors associated with the switchable current source is equal to the ratio of the respective series, bias resistors connected to the device.

The circuit further includes control means for measuring the value of the output signal from the differential amplifier and for controlling the switchable current source. The control means includes means for subtracting the value of the output signal from the differential amplifier when the switchable current source is OFF from the value of the output signal from the differential amplifier when the switchable current source is ON. From the determined difference, the resistance value of the device is calculated.

Also, in accordance with the present invention, a method is provided for monitoring the resistance of an electrical device connected to potentials of a source of electrical energy through a first resistive, bias network so as to have a common-mode voltage present at the device. The method comprises the steps of amplifying a voltage developed across the device using a differential amplifier, measuring a first value of the output of the differential amplifier when a voltage is developed across the device because the device is biased to the source of electrical energy through the first resistive, bias network, providing a second current source for the device by connection to the source of electrical energy through a second resistive, bias network, the second resistive bias network having values so as not to shift the common-mode voltage present at the device from that present due to the first resistive bias network, measuring a second value of the output of the differential amplifier when second current source is provided, and subtracting the first measured value from the second measured value, the resultant subtraction being a value functionally related to the resistance device.

BRIEF DESCRIPTION OF THE DRAWING

Further features of the present invention will become apparent to those skilled in the art to which the present invention relates from reading the following specification with reference to the accompanying drawing which shows a schematic of an impedance measurement circuit in accordance with the present invention.

DESCRIPTION OF A PREFERRED EMBODIMENT

Referring to the FIGURE, an impedance measurement circuit 10 is operatively connected to a squib 12 having a resistance value equal to $R_{sq}$. The squib 12 has a first terminal 14 connected to a positive potential $V_s$ of a source of electrical energy through an inertia switch assembly 16. The inertia switch assembly 16 includes an inertia switch 18 and a resistor R20. Squib 12 has a terminal 22 connected to a ground potential of the source of electrical energy through an inertia switch assembly 24. The inertia switch assembly 24 includes an inertia switch 26 and a parallel connected resistor R28.

The impedance measurement circuit 10 includes an integrated circuit, operational amplifier 30 having its power supply connections 32, 34 respectively connected to the positive potential $V_s$ and the ground potential of the source of electrical energy. The noninverting input 36 of the operational amplifier 30 is electrically connected to the terminal 14 of the squib 12 through resistor R38. The noninverting input 40 of the operational amplifier 30 is electrically connected to terminal 22 of the squib 12 through resistor R42. The output 44 of the operational amplifier 30 is connected to the inverting input 40 through a resistor R46. A filter capacitor 48 is electrically connected to the inverting input 40 of the operational amplifier 30 and to electrical ground of the source of electrical energy. The noninverting input 36 is connected to a voltage reference $V_{cc}$ through a resistor R50. A filter capacitor 52 is connected to the noninverting input 36 of the operational amplifier 30 and to electrical ground of the source of electrical energy.

The output 44 of the operational amplifier 30 is connected to an input 54 of an analog-to-digital ("A/D") converter 56 through a voltage dividing network 58 including resistors R60 and R62. A filter capacitor 64 is electrically connected to the junction of resistors R60, R62 and electrical ground of the source of electrical energy. A second input 66 of the A/D converter 56 is electrically connected to the positive potential $V_s$ of the source of electrical energy through a resistor dividing network 68 including resistors R70 and R72. A filter capacitor 74 is electrically connected to the junction of resistors R70, R72 and to electrical ground of the source of electrical energy.

A microcomputer 76 is operatively coupled to the A/D converter 56. The interconnection and interaction between a microcomputer and an A/D converter are well known in the art and need not be explained herein in detail. Briefly, the microcomputer through address lines selects an input for which the A/D converter is to convert an analog voltage value present at that input into a digital signal representing the value of that analog signal. In the present circuit, the microcomputer 76 controls the A/D converter to monitor either the input 54 or the input 66. The A/D converter outputs a digital representation of the analog value present at the selected input 54 or 66.

The microcomputer 76 includes a first output 80 connected to a first switching circuit 82. The microcomputer 76 further includes a second output 84 connected to second switching circuit 86.

The first switching circuit 82 includes a resistor dividing network 90 including resistors R92 and R94. The junction of resistors R92, R94 is connected to the base of an NPN transistor 96. The emitter of transistor 96 is connected to electrical ground and the collector is connected to the positive potential $V_S$ of the source of electrical energy through resistors R98, R100. The junction of resistors R98, R100 is connected to the base of a PNP transistor 102. The emitter of transistor 102 is connected to the positive potential $V_S$ of the source of electrical energy. The collector of transistor 102 is electrically connected to the terminal 14 of the squib 12 through a resistor R104.

The second switching circuit 86 includes a resistor dividing network 110 including resistors R112, R114. The junction of resistors R112, R114 is electrically connected to the base of an NPN transistor 116. The emitter of transistor 116 is connected to electrical ground. The collector of transistor 116 is connected to the terminal 22 of the squib 12 through a resistor R118.

The microcomputer 76 further includes an output 120 electrically connected to an indicator 122. The indicator may take one of several forms, such as a lamp. The microcomputer output 120 controls whether the lamp is unenergized or energized to inform the vehicle operator of a malfunction condition. The microcomputer further includes an output 123 electrically connected to an electrically eraseable programmable read only memory ("EEPROM") 124. The EEPROM 124 is a nonvolatile memory which permits the microcomputer to store data or error codes for later diagnostic analysis by a service technician.

If the values of resistors R20 and R28 are substantially greater than the resistance of the squib, the current through the squib $I_{SQ1}$ can be expressed as:

$$I_{SQ1} = \frac{V_S}{(R20 + R28)} \quad (1)$$

when transistors 102, 116 are OFF. The voltage at terminal 22 of squib 12 is defined as V1 and can be expressed as:

$$V1 = VCM - \tfrac{1}{2}VDM \quad (2)$$

and the voltage at terminal 14 is defined as V2 and can be expressed as:

$$V2 = VCM + \tfrac{1}{2}VDM \quad (3)$$

where VCM is the common-mode voltage present at squib 12 and VDM is the differential-mode voltage. The output of the amplifier 30, $V_{out}$, can be expressed as:

$$V_{out} = \left(\frac{R50}{R42}\right) \cdot \left[\frac{R42 + R46}{R38 + R50}\right] \cdot V2 - \left(\frac{R46}{R42}\right) \cdot V1 \quad (4)$$

Substituting equations (2) and (3) into equation (4) yields:

$$V_{out} = \left(\frac{R50}{R42}\right) \cdot \left[\frac{R42 + R46}{R38 + R50}\right] \cdot \quad (5)$$

$$(VCM + 1/2 VDM) - \left(\frac{R46}{R42}\right) \cdot (VCM - 1/2 VDM)$$

When the microcomputer 76 actuates the switching circuits 82 and 86 so as to drive both transistors 102, 116 ON, the current $I_{SQ2}$ through the squib 12 can be expressed as:

$$I_{SQ2} = \frac{V_S}{\left(\frac{R104 \; R20}{R104 + R20}\right) + \left(\frac{R118 \; R28}{R118 + R28}\right)} \quad (6)$$

The resistors R20, R28, R104, R118 are selected such that the ratio of resistor R20 to resistor R28 is equal to the ratio of resistor R104 to R118, i.e.:

$$\left(\frac{R20}{R28}\right) = \left(\frac{R104}{R118}\right) \quad (7)$$

In this manner, the actuation of the switching circuits 82, 86 causes an increased voltage to be developed across the squib but does not shift value of the common-mode voltage present at the squib 12. Therefore, VCM is the value of the common-mode voltage at the squib 12 when the switching circuits 82, 86 are ON or OFF. Only the differential-mode voltage changes. VDM2 is defined as the differential voltage across squib 12 when the switching circuits 82, 86 are ON. VDM1 is defined as the differential voltage across squib 12 when the switching circuits 82, 86 are OFF. The difference Vdiff of the output voltage when the switching circuits 82, 86 are ON and OFF is equal to:

$$V_{diff} = V_{out2} - V_{out1} = \left(\frac{R50}{R42}\right) \cdot \left[\frac{R42 + R46}{R38 + R50}\right] \cdot \quad (8)$$

$$(VCM + 1/2 VDM2) - \left(\frac{R46}{R42}\right) \cdot (VCM - 1/2 VDM2) -$$

$$\left(\frac{R50}{R42}\right) \cdot \left[\frac{R42 + R46}{R38 + R50}\right] \cdot (VCM + 1/2 VDM1) +$$

$$\left(\frac{R46}{R42}\right) \cdot (VCM - 1/2 VDM1)$$

Since the ratio set forth in equation (7) has been selected for resistors R20, R28, R104, R118, the common-mode voltage value does not shift and equation (8) reduces to:

$$V_{diff} = \left[\left(\frac{R50}{R42}\right) \cdot \left[\frac{R42 + R46}{R38 + R50}\right] + \left(\frac{R46}{R42}\right)\right] \cdot \left(\frac{VDM2}{2}\right) - \quad (9)$$

$$\left[\left(\frac{R50}{R42}\right) \cdot \left[\frac{R42 + R46}{R38 + R50}\right] + \left(\frac{R46}{R42}\right)\right] \cdot \left(\frac{VDM1}{2}\right)$$

As can be seen from equation (9), the voltage component in equation (8) due to the presence of the common-mode voltage cancels from the calculation. Therefore, any variations in common-mode voltage value due to variations in the power supply has no effect on the difference value calculated in equation (9). Also, the difference value eliminates any errors from input offset voltage errors, input offset current errors, offset errors due to finite gain of operational amplifier, and errors due to output offset from Vcc.

If R38 is set equal to R42 and R50 is set equal to R46, equation (9) reduces to:

$$V_{diff} = \left(\frac{R46}{R42}\right) \cdot (VDM2 - VDM1) \quad (10)$$

R46/R42 defines the gain of the differential amplifier 30. Equation (10) can be expressed as:

$$V_{diff} = \text{gain}(V2 - V1) \quad (11)$$

Since Vdiff=Vout2−Vout1, the voltage developed across the squib 12 can be expressed as:

$$V2 - V1 = (V_{out2} - V_{out1})/\text{gain} \quad (12)$$

From Ohm's law, the squib resistance $R_{SQ}$ can be expressed as:

$$R_{SQ} = \frac{V2 - V1}{I_{SQ2} - I_{SQ1}} \quad (13)$$

The difference in squib current when the transistors 102, 116 are ON and OFF can be expressed as:

$$I_{SQ2} - I_{SQ1} = \frac{V_S}{(R104 + R118)} \quad (14)$$

Substituting equations (12) and (14) into equation (13) yields:

$$R_{SQ} = \left[\frac{(V_{out2} - V_{out1})/\text{gain}}{V_S}\right] \cdot (R104 + R118) \quad (15)$$

The voltage value present at input 66 ("V(66)") of the A/D converter is functionally related to the value of the voltage source $V_S$ according to:

$$V_S = \left[\frac{R70 + R72}{R72}\right] \cdot V(66) \quad (16)$$

The value of the voltage present at the output of the operational amplifier 30 when transistors 102, 116 are OFF ("V(54)OFF") and ON ("V(54)ON") can be expressed as:

$$V_{out1} = \left[\frac{R60 + R62}{R62}\right] \cdot V(54)\text{OFF} \quad (17)$$

and $$V_{out2} = \left[\frac{R60 + R62}{R62}\right] \cdot V(54)\text{ON} \quad (18)$$

Substituting equations (16), (17), and (18) into (15) yields:

$$R_{SQ} = \left(\frac{R72}{R62}\right) \cdot \left[\frac{R62 + R60}{R70 + R72}\right] \cdot \left[\frac{R104 + R118}{\text{gain}}\right] \cdot \quad (19)$$

$$\left[\frac{V(54)(ON) - V(54)(OFF)}{V(66)}\right]$$

The term $$\left(\frac{R72}{R62}\right) \cdot \left[\frac{R62 + R60}{R70 + R72}\right] \cdot \left[\frac{R104 + R118}{\text{gain}}\right] \quad (20)$$

can be set equal to K which is a value that is substantially constant. Equation (19) then becomes:

$$R_{SQ} = K \cdot \left[\frac{V(54)\text{ON} - V(54)\text{OFF}}{V(66)}\right] \quad (21)$$

The microcomputer calculates the impedance $R_{SQ}$ of the squib from equation (21) by (i) measuring the voltage value at input 54 when the switches 82, 86 are ON, (ii) subtracting the voltage value at input 54 when the switches 82, 86 are OFF, (iii) dividing by the voltage value at input 66, and (iv) multiplying by a constant K which has been predetermined according to (20). The calculated value is compared against upper and lower limits stored in a memory of the microcomputer 76. If the calculated value is outside of the limits, the indicator 122 is energized and fault data is stored in the EEPROM 124.

The second current supplied through transistors 102, and resistors R104, R118 is less than that necessary to fire the squib, but is greater than that provided through bias resistors R20, R28. This permits a reduced gain in amplifier 30 thereby minimizing the gain error effect.

Although the invention has been described with reference to an air bag system, the invention is applicable to any impedance measurement circuit that uses a differential amplifier. From the above description of a preferred embodiment of the invention, those skilled in the art will perceive improvements, changes and modifications. Such improvements, changes and modifications within the skill of the art are intended to be covered by the appended claims.

Having described a preferred embodiment of the invention, we claim:

1. A circuit for monitoring the resistance of an electrical device biased between potentials of a source of electrical energy by series resistors connected to respective terminals of the device, said circuit comprising:
   a differential amplifier having its input terminals connected to respective terminals of the device, said differential amplifier providing an output signal having a value indicative of the voltage developed across the device;
   a switchable current source connected to the device, said switchable current source having first switching means and an associated first resistor connected in series to one terminal of the device and to one potential of the source of electrical energy, and second switching means and an associated second resistor connected in series to the other terminal of the device and to the other potential of the source of electrical energy, said switchable current source, when actuated, providing a second amount of current through the device, the ratio of the first and second resistors of the switchable current source being substantially equal to the ratio of the respective resistors connected to the respective terminals of the device; and
   control means for measuring the value of the output signal from said differential amplifier and for controlling said switchable current source, said control means subtracting the value of the output signal of the differential amplifier when said switchable current source is not actuated from the value of the output signal of the differential amplifier when said switchable current source is actuated, said difference being a value functionally related to the resistance value of said device.

2. The circuit of claim 1 wherein the control means further multiplies the difference value by a constant having a value dependent upon gain of the differential amplifier, compares the value of the resultant multiplication against upper and lower limits of resistance values, and provides an indication when the resistance of the device is not within predetermined limits.

3. The circuit of claim 1 wherein said control means further measures the value of the source of electrical energy and divides the difference of the value of the output signal of the differential amplifier when said switchable current source is not actuated from the value of the output signal of the differential amplifier when said switchable current source is actuated by the measured value of the source of electrical energy, the resultant division ratio metrically compensating for variations in the value of the source of electrical energy.

4. The circuit of claim 3 wherein said control means further multiplies the resultant division by a constant having a value dependent upon gain of the differential amplifier.

5. The circuit of claim 1 wherein said first switching means includes a PNP transistor having its emitter connected to the positive potential of the source of electrical energy, its collector connected to said first associated resistor, and its base connected to the collector of a first NPN transistor, the emitter of the first NPN transistor connected to electrical ground potential of the source of electrical energy, and the base of the first NPN transistor connected to said control means.

6. The circuit of claim 5 wherein said second switching means includes a second NPN transistor having its collector connected to its associated second resistor, its emitter connected to electrical ground potential of the source of electrical energy, and its base connected to said control means.

7. The circuit of claim 1 wherein said control means includes an analog-to-digital converter connected to the output of said differential amplifier, and a microcomputer connected to the analog-to-digital converter, said microcomputer having predetermined limits for the difference between the output value of the differential amplifier when the current source is actuated and not actuated, said microcomputer providing a signal to an indication means when the microcomputer determines the difference does not fall within said predetermined limits.

8. A circuit for monitoring the resistance of an electrical device connected to a source of electrical energy through a resistive, bias network so as to have a common-mode voltage value present at the device, said circuit comprising:
   a differential amplifier connected across the device for providing an output voltage having a voltage value functionally related to a voltage developed across the device;
   switchable current source for, when actuated, providing current through the device in addition to current through the device provided by the resistive, bias network, said switchable current source including associated bias resistors, each having a value so as not to shift the value of the common-mode voltage present at the device when the switchable current source is switched from an unactuated condition to an actuated condition; and
   control means for subtracting the value of differential amplifier output signal when the switchable current source is not actuated from the value of the differential amplifier output signal when the switchable current source is actuated, the difference value therebetween being directly proportional to the resistance value of the device.

9. The circuit of claim 8 wherein the control means further multiplies said difference value by a constant having a value related to gain of the differential amplifier, the resultant multiplication having a value indicative of the resistance value of the device.

10. The circuit of claim 9 wherein the control means further measures the value of the source of electrical energy, and divides the resultant multiplication value by the measured value of the source of electrical energy so as to ratiometrically compensate the determination of the resistance value of the device for changes in value of the source of electrical energy.

11. A circuit for monitoring the resistance of an electrical device biased between potentials of a source of electrical energy by series, bias resistors connected to respective terminals of the device, said circuit comprising:

a differential amplifier having its input terminals connected to respective terminals of the device, its positive power terminal connected to a positive potential of the source of electrical energy and its negative power terminal connected to a negative terminal of the source of electrical energy, said differential amplifier providing an output signal having a value indicative of the voltage developed across the device;

a switchable current source connected to the device, said switchable current source having first switching means and an associated first resistor connected in series to one terminal of the device and to one potential of the source of electrical energy, and second switching means and an associated second resistor connected in series to the other terminal of the device and to the other potential of the source of electrical energy, said switchable current source providing a second current through the device when the second current source is ON, the ratio of the first and second resistors of the switchable current source being equal to the ratio of the respective series, bias resistors connected to the respective terminals of the device; and control means for measuring the value of the output signal from said differential amplifier and for controlling said switchable current source, said control means subtracting the value of the output signal of the differential amplifier when said switchable current source is OFF from the value of the output signal of the differential amplifier when said switchable current source is ON, said difference being a value indicative of the resistance value of said device.

12. The circuit of claim 11 wherein the control means further multiplies the difference value by a constant having a value dependent upon gain of the differential amplifier, compares the value of the resultant multiplication against upper and lower limits of resistance values, and provides an indication when the resistance of the device is not within predetermined limits.

13. The circuit of claim 11 wherein said control means further measures the value of the source of electrical energy and divides the difference of the value of the output signal from the differential amplifier when said switchable current source is OFF from the value of the output signal from the differential amplifier when said switchable current source is ON by the measured value of the source of electrical energy, the resultant division ratiometrically compensating for variations in the value of the source of electrical energy.

14. The circuit of claim 13 wherein said control means further multiplies the resultant division by a constant having a value dependent upon the gain of the differential amplifier.

15. The circuit of claim 11 wherein said first switching means includes a PNP transistor having its emitter connected to the positive potential of the source of electrical energy, its collector connected to said first associated resistor, and its base connected to the collector of a first NPN transistor, the emitter of the first NPN transistor connected to electrical ground potential of the source of electrical energy, and the base of the first NPN transistor connected to said control means.

16. The circuit of claim 15 wherein said second switching means includes a second NPN transistor having its collector connected to its associated second resistor, its emitter connected to electrical ground potential of the source of electrical energy, and its base connected to said control means.

17. The circuit of claim 11 wherein said control means includes an analog-to-digital converter connected to the output of said differential amplifier, and a microcomputer connected to the analog-to-digital converter, said microcomputer having predetermined limits for the difference between the output value of the differential amplifier when the current source is ON and OFF, said microcomputer providing a signal to an indication means when the microcomputer determines the difference does not fall within said predetermined limits.

18. A method for monitoring the resistance of an electrical device connected to potentials of a source of electrical energy through a first resistive, bias network so as to have a common-mode voltage present at the device, said method comprising the steps of:
(a) amplifying a voltage developed across the device using a differential amplifier;
(b) measuring a first value of the output of the differential amplifier when a voltage is developed across the device because the device is biased to the source of electrical energy through the first resistive, bias network;
(c) providing a second current source for the device by connection to the source of electrical energy through a second resistive, bias network, the second resistive bias network having values so as not to shift the common-mode voltage present at the device from that present from the first resistive bias network;
(d) measuring a second value of the output of the differential amplifier when second current source is provided; and
(e) subtracting the first measured value from the second measured value, the resultant subtraction being a value functionally related to the resistance device.

19. The method of claim 18 further including the step of:
(f) multiplying the resultant subtraction by a constant having a value dependent upon gain of the differential amplifier.

20. The method of claim 19 further including the steps of:
(g) measuring the value of the source of electrical energy; and
(h) dividing the resultant multiplication by the measured value of the source of electrical energy.

21. The method of claim 20 further including the steps of:
(i) comparing the resultant division value against upper and lower, predetermined limits; and
(j) providing an indication when the resultant division value is outside of the predetermined limits.

* * * * *